US012640510B2

(12) United States Patent
Wang et al.

(10) Patent No.: US 12,640,510 B2
(45) Date of Patent: May 26, 2026

(54) LAPTOP COMPUTER

(71) Applicant: Acer Incorporated, New Taipei City (TW)

(72) Inventors: Yu-Shih Wang, New Taipei City (TW); Wen-Chieh Tai, New Taipei City (TW); Chih-Chun Liu, New Taipei City (TW); Dong-Sheng Wu, New Taipei City (TW); Tzu-Wei Lin, New Taipei City (TW); Yi-Mu Chang, New Taipei City (TW)

(73) Assignee: Acer Incorporated, New Taipei City (TW)

( * ) Notice: Subject to any disclaimer, the term of this patent is extended or adjusted under 35 U.S.C. 154(b) by 275 days.

(21) Appl. No.: 18/623,059

(22) Filed: Apr. 1, 2024

(65) Prior Publication Data

US 2025/0141142 A1     May 1, 2025

(30) Foreign Application Priority Data

Oct. 27, 2023    (TW) .................................. 112141305

(51) Int. Cl.
H01R 13/24 (2006.01)
G06F 1/183 (2026.01)
G06F 1/20 (2006.01)
H05K 7/20 (2006.01)

(52) U.S. Cl.
CPC ......... H01R 13/2421 (2013.01); G06F 1/183 (2013.01); G06F 1/203 (2013.01); H05K 7/20136 (2013.01)

(58) Field of Classification Search
CPC   H01R 13/2421; H01R 12/7076; H01R 13/24; G06F 1/183; G06F 1/203; G06F 1/1656; G06F 1/1616; H05K 7/20136–2019
See application file for complete search history.

(56) References Cited

U.S. PATENT DOCUMENTS

| | | | | |
|---|---|---|---|---|
| 7,458,818 | B2 * | 12/2008 | Kiyofuji | ............ H01R 13/2421 |
| | | | | 324/750.07 |
| 2002/0155735 | A1 * | 10/2002 | Zhou | ................... G01R 1/06733 |
| | | | | 439/66 |
| 2015/0056870 | A1 * | 2/2015 | Chen | ................... H01R 13/2421 |
| | | | | 439/700 |
| 2023/0062807 | A1 * | 3/2023 | Sun | ........................ H01R 13/24 |

* cited by examiner

*Primary Examiner* — Jacob R Crum
(74) *Attorney, Agent, or Firm* — JCIPRNET

(57) ABSTRACT

A laptop computer including a circuit board, a connector, and a fan is provided. The circuit board has a plurality of first electrically conducting members. The connector has a body and a plurality of clamping terminals and pogo pin terminals extended from the body. The clamping terminals and the pogo pin terminals are electrically connected to each other and located at two opposite sides of the body. The clamping terminals clamp the circuit board and are electrically connected to the first electrically conductive members. The fan has a plurality of second electrically conducting members, and the pogo pin terminals are respectively abutted against abutting surfaces of the second electrically conducting members, such that the circuit board is electrically connected to the fan via the connector, wherein each of the abutting surfaces is tilted relative to a plane where the pogo pin terminals are arranged.

10 Claims, 5 Drawing Sheets

LAPTOP COMPUTER

CROSS-REFERENCE TO RELATED APPLICATION

This application claims the priority benefit of Taiwan application serial no. 112141305, filed on Oct. 27, 2023. The entirety of the above-mentioned patent application is hereby incorporated by reference herein and made a part of this specification.

BACKGROUND OF THE INVENTION

Field of the Invention

The invention relates to a laptop computer.

Description of Related Art

ESG is the abbreviation of three English words, namely Environment, Social, and Governance. The United Nations Global Compact first proposed the concept of ESG in 2004, and it is regarded as an indicator for evaluating a company's operations. ESG is a measure of a company's sustainable development indicators, which are the carbon reduction and sustainable development goals required by international and domestic governments. In the past, business operations only needed to pay attention to financial data. However, even if the financial reports were promising, if the operations violated human rights, discharged wastewater, infringed on the rights of consumers, and harmed the living environment of the Earth's creatures, the international goal of promoting earth sustainability is violated, prompting institutional investors to reduce investment and cooperation in such companies, and even affecting the company's reputation. Today, companies that value the ESG concept not only have transparent financial reports, but also have stable, low-risk operating models, and their long-term performance is also relatively stable. For the above reasons, for the electronics manufacturing industry, whether the products manufactured thereby may meet the above conditions has become one of the product evaluation conditions.

Taking laptop computers as an example, whether the above conditions may be met depends on the energy consumed in the manufacturing process of the product and whether the product has the ability to be repaired (renewed). In order to achieve the above goals, the member design and assembly configuration of laptop computers require corresponding new techniques and measures.

In terms of assembly and configuration, the assembly process of existing laptop computers includes the positioning and buckling of tenons or hooks, the welding of members or electronic elements, screw locking and fixing, and the docking of related electrical conducting members (connectors, cables, or wires, FPC) . . . etc. In addition to the high complexity of the process, related accessories and consumables often do not meet the aforementioned sustainability conditions. Especially for subsequent maintenance and disassembly, the relevant connection ports or connectors of the members are readily covered due to stacking, making it unlikely for the operator to readily disassemble and assemble the members and reducing the regeneration capacity of the laptop computer. In addition, after the assembly is completed, there may be situations such as members being separated due to vibration or falling, etc., or the electrical conducting members falling off.

SUMMARY OF THE INVENTION

The invention provides a laptop computer. Via an intuitive assembly structure formed by a circuit board, a connector, and a fan, the difficulty of disassembly and assembly of members may be effectively reduced under the premise of maintaining structural strength and ensuring electrical connections.

A laptop computer of the invention includes a circuit board, a connector, and a fan. The circuit board has a plurality of first electrically conducting members. The connector has a body and a plurality clamping terminals and pogo pin terminals extended from the body. The clamping terminals and the pogo pin terminals are electrically connected to each other and located at two opposite sides of the body. The clamping terminals clamp the circuit board and are electrically connected to the first electrically conductive members. The fan has a plurality of second electrically conducting members, and the pogo pin terminals are respectively abutted against abutting surfaces of the second electrically conducting members, such that the circuit board is electrically connected to the fan via the connector, wherein each of the abutting surfaces is tilted relative to a plane where the pogo pin terminals are arranged.

Based on the above, the circuit board and the fan may simultaneously complete the electrical connection requirements via the structural assembly process of the connector, wherein the plurality of first electrically conductive members at the circuit board and the upper and lower surfaces thereof are clamped by the clamping terminals of the connector, so that the electrical connection between the connector and the circuit board is completed. Correspondingly, the fan is partially provided with a plurality of second electrically conductive members, and the connector also has a plurality of pogo pin terminals. The pogo pin terminals are arranged on a plane, and the abutting surfaces of the second electrically conductive members are tilted relative to the plane. Therefore, during the assembly process of the fan and the connector, the pogo pin terminals may always maintain an abutting relationship with the second electrically conductive members due to the tilted abutting surfaces. Thereby, the electrical connection relationship between the connector and the fan is maintained.

In this way, the circuit board, the connector, and fan may be assembled using the above intuitive members, while simultaneously completing the effect of electrical assembly to effectively improve the convenience of assembly of related members of the laptop computer, thus further improving the regeneration (repairability) capability of the laptop computer to meet sustainability conditions.

DESCRIPTION OF THE EMBODIMENTS

Figure 1:
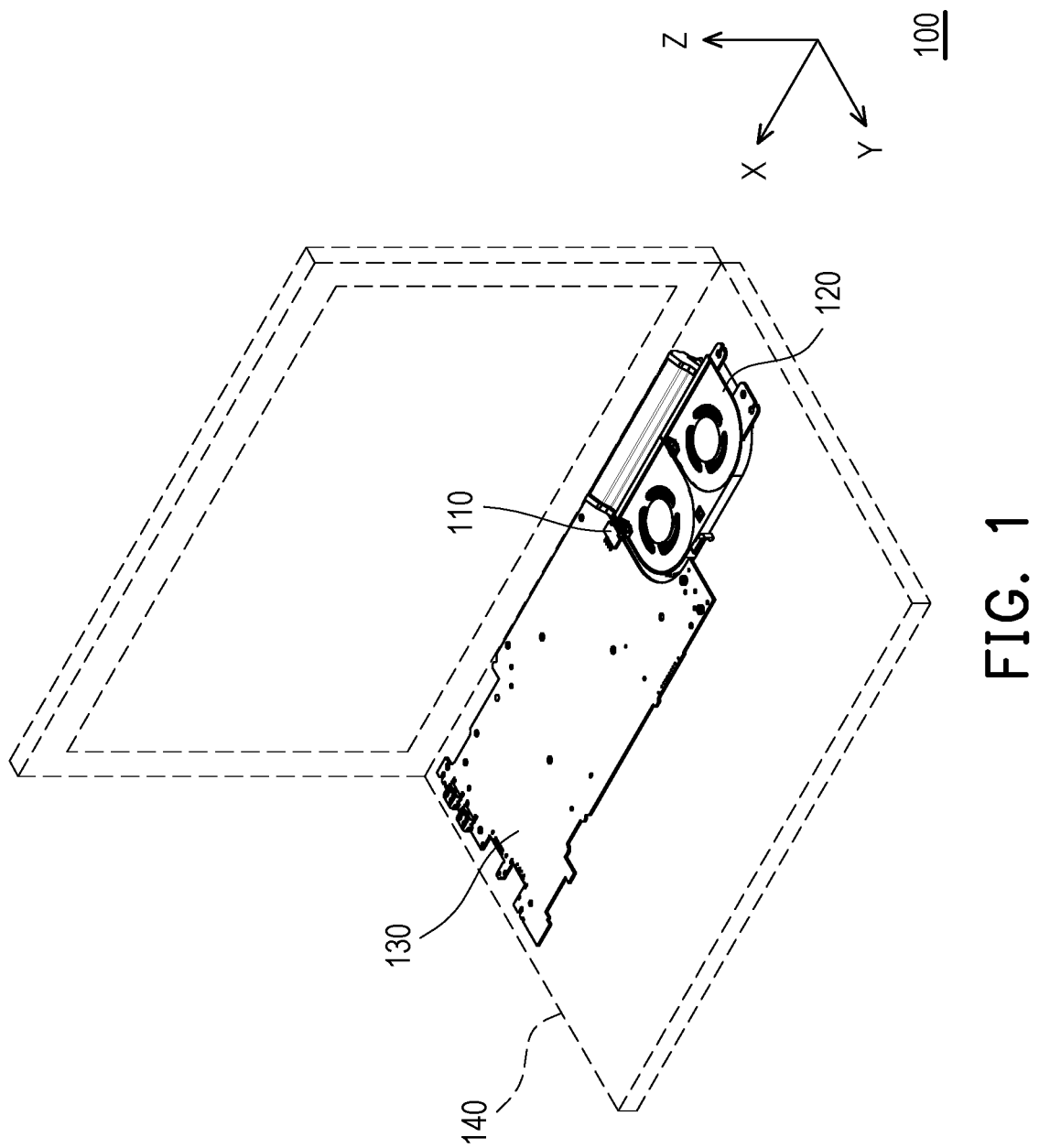
FIG. 1 is a schematic diagram of a laptop computer according to an embodiment of the invention.

FIG. 1 is a schematic diagram of a laptop computer according to an embodiment of the invention. Please refer to FIG. 1. In the present embodiment, a laptop computer 100 includes a body 140 (for example, a host), a circuit board 130 (for example, a motherboard), a connector 110, and a fan 120 disposed in the body 140. The remaining undisclosed members are already available in existing laptop computers and are not described again. It should also be mentioned that the present embodiment provides Cartesian coordinates X-Y-Z to facilitate member description. At the same time, the body 140, the circuit board 130, the fan 120, and the connector 110 of the present embodiment may be considered to be located at the X-Y plane.

Figure 2:
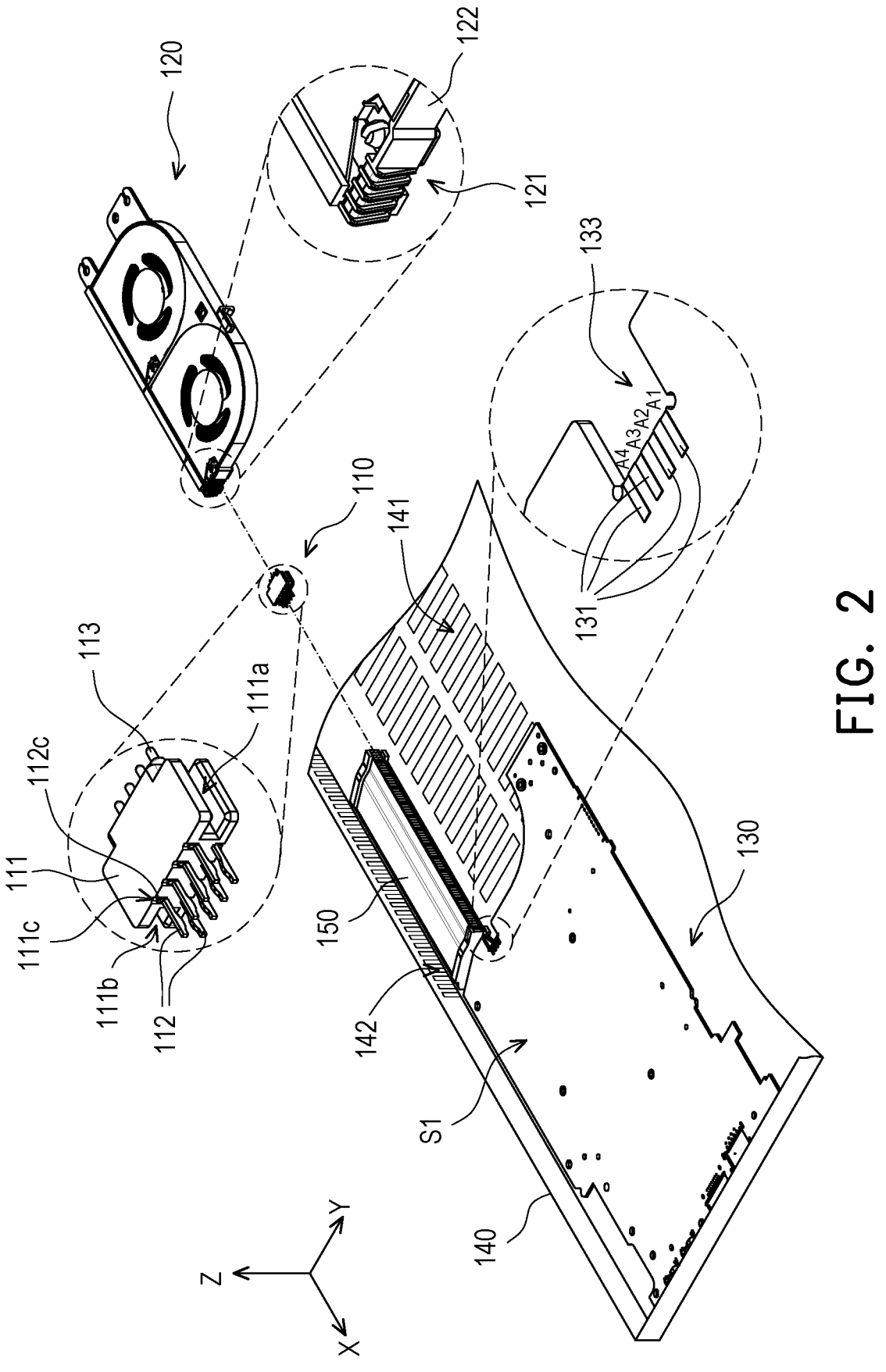
FIG. 2 is an exploded schematic diagram of some members within a laptop computer.
Figure 3:
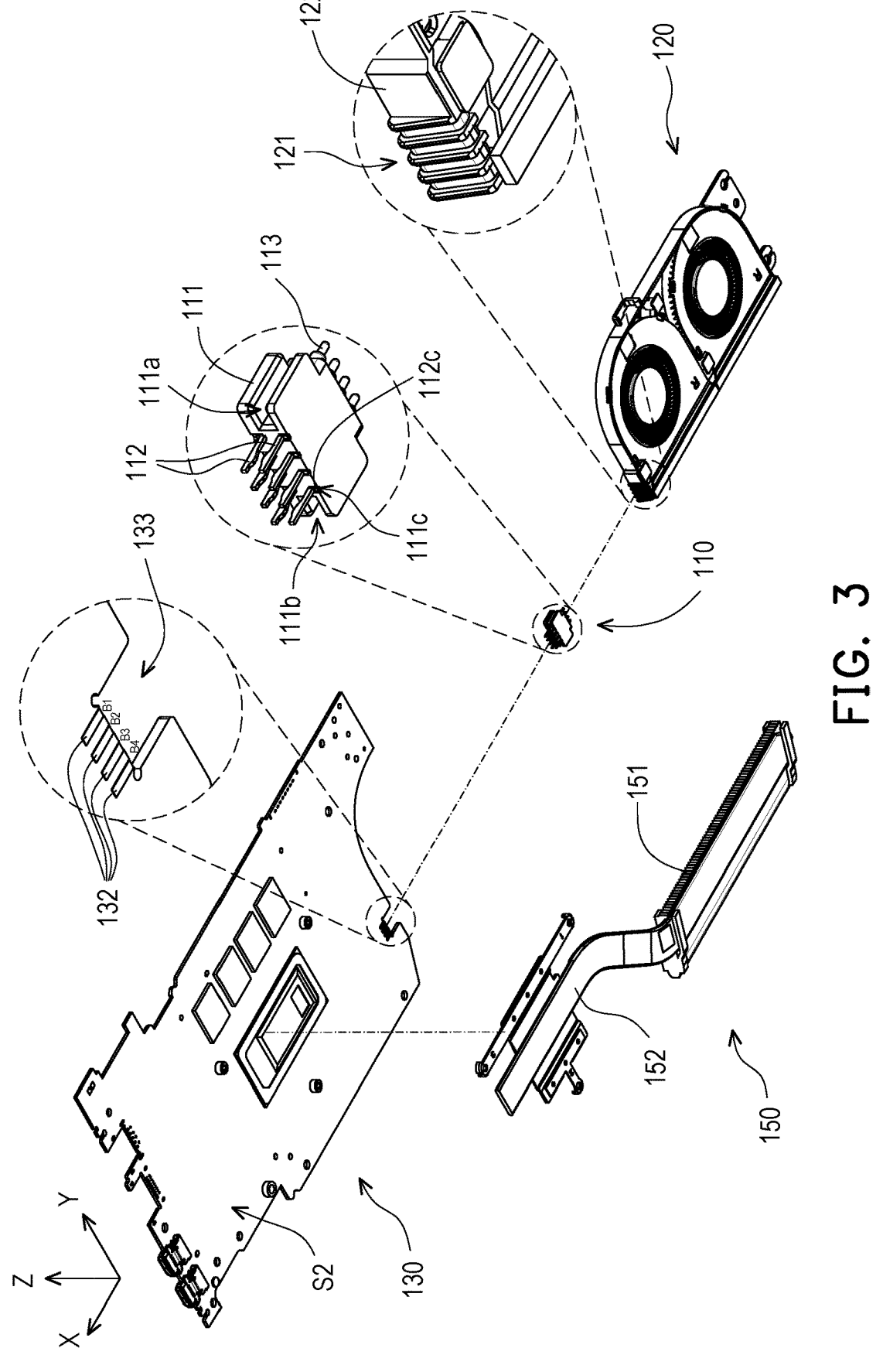
FIG. 3 shows an exploded view of some members of a laptop computer from another perspective.

FIG. 2 is an exploded schematic diagram of some members within a laptop computer. FIG. 3 shows an exploded view of some members of a laptop computer from another perspective. Please refer to FIG. 2 and FIG. 3 at the same time. In the present embodiment, the circuit board 130 has two surfaces (a surface S1, a surface S2, each parallel to the X-Y plane) facing each other, and a plurality of first electrically conductive members 131 disposed at the surface S1 and a plurality of first electrically conductive members 132 disposed at the surface S2. Here, the first electrically conductive members 131 and 132 are contact pads disposed on the circuit board 130. The connector 110 has a body 111 and a plurality of clamping terminals 112 and a plurality of pogo pins 113 extended from the body 111 (along the X-axis), the clamping terminals 112 and the pogo pin terminals 113 are electrically connected to each other and located at two opposite sides of the body 111, and the pogo pin terminals 113 may be considered to be arranged on the X-Y plane or on a plane parallel to the X-Y plane.

The fan 120 is a centrifugal fan having an axial (along the Z-axis direction) air inlet and a radial (along the Y-axis direction) air outlet, wherein a portion of the air inlet corresponds to an opening 141 of the body 140 to facilitate external ambient air to flow to the fan 120 via the opening 141. The laptop computer 100 also includes a heat dissipation member 150 formed by a heat pipe 152 and a fin 151, wherein the heat pipe 152 is used to transmit the heat source from an electronic element (located on the circuit board 130, such as where the assembly line is connected) to the fin 151, and the fin 151 is located between the air outlet of the fan 120 and the opening 142 of the body 140 to facilitate the airflow generated by the fan 120 to blow from the air outlet to the fin 151 and then be discharged out of the body 140 via the opening 142.

As mentioned above, the assembly process of existing laptop computers is complicated. For operators, it is necessary to perform the plug-in action of electrical wiring when assembling members. Therefore, the assembly process readily becomes complicated, not to mention if the connection port or the connector is in a position that is out of sight, the user may only complete the plug-in action blindly, thus significantly causing inconvenience.

Accordingly, in the present embodiment, instead, the connector 110 is used for intuitive structural connection between the circuit board 130 and the fan 120, that is, the electrical connection process is completed during the assembly process of the members to reduce the inconvenience to operators caused by plugging and unplugging operations.

Figure 4A:
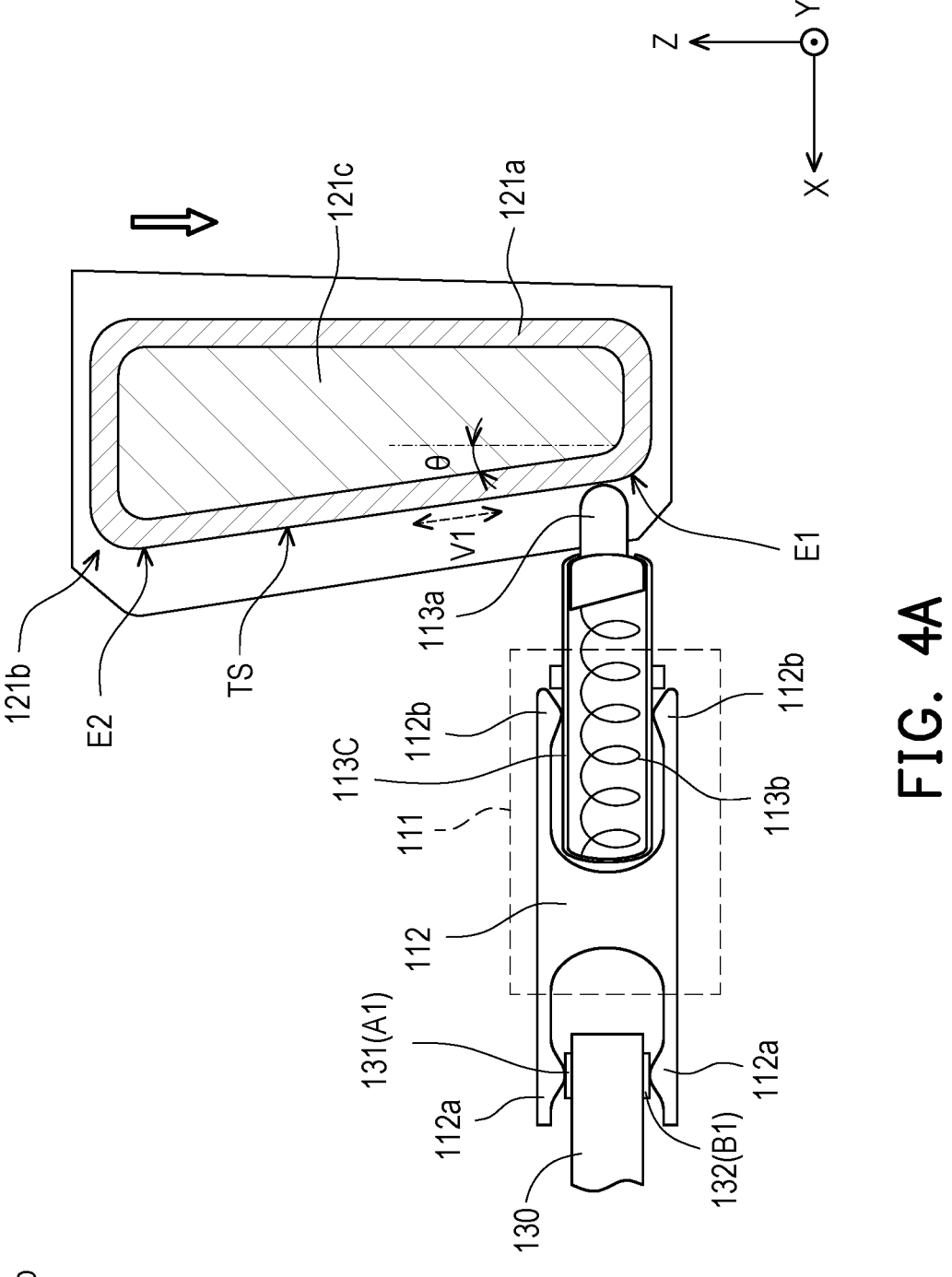
FIG. 4A and FIG. 4B illustrate the assembly process of a fan and a circuit board in partial cross-section.
Figure 4B:
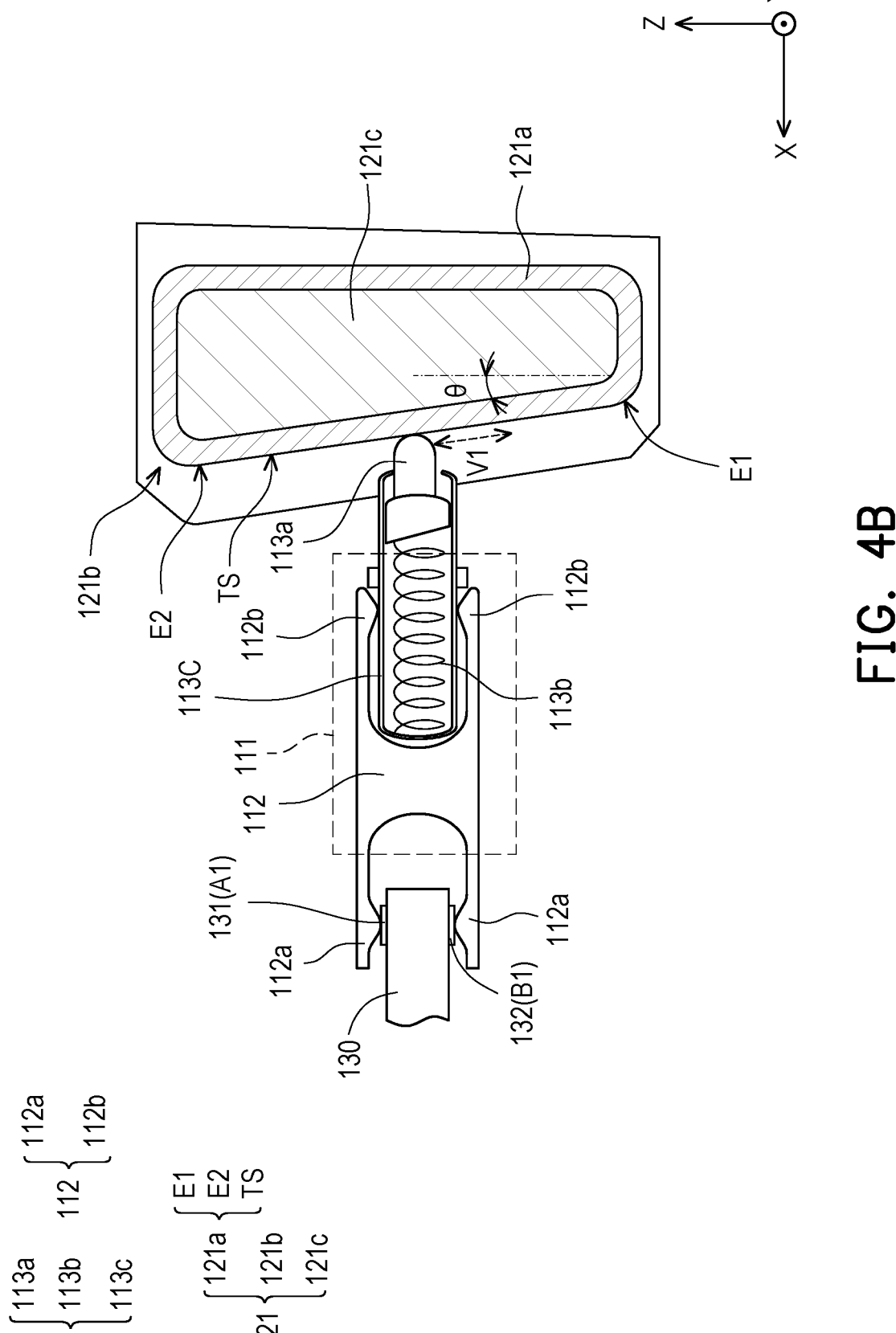

Specifically, the fan 120 has a sidewall 122 and a connection port 121 is partially formed of the sidewall 122 and equipped with an electrically conductive terminal for docking with the connector 110. FIG. 4A and FIG. 4B illustrate the assembly process of a fan and a circuit board in partial cross-section. Please refer to FIG. 2, FIG. 3, and FIG. 4B. FIG. 4B shows a diagram after the connection port 121 of the fan 120 is connected between the connector 110 and the circuit board 130. In the present embodiment, the connection port 121 includes a second electrically conductive member 121a, an annular groove 121b, and a main structure 121c, wherein the main structure 121c has the same structure as the sidewall 122 of the fan 120, or the main structure 121c may be regarded as a portion of the extended structure of the sidewall 122. Moreover, the main structure 121c at the connection port 121 is not the same thickness as the sidewall 122, but a plurality of annular grooves 121b are formed on a plurality of cross sections of the sidewall 122, and the second electrically conductive member 121a is disposed in the annular grooves 121b to surround the main structure 121c, so that the second electrically conductive member 121a forms a closed contour. In this way, the connection port 121 with a straight waterfall structure may be smoothly formed on the sidewall 122 of the fan 120, including a straight waterfall-shaped annular groove 121b and a straight waterfall-shaped second electrically conductive member 121a, and the second electrically conductive member 121a has an electrical connection relationship with a power unit (such as a motor, not shown here) of the fan 120.

Based on the above members, in the laptop computer 100 of the present embodiment, the connector 110 is connected between the circuit board 130 and the connection port 121 of the fan 120 to complete electrical conduction between the three. Further, please refer to FIG. 2 and FIG. 3 again. The circuit board 130 of the present embodiment has a notch 133 located at the side edge and first electrically conductive members 131 and 132 located at the bottom side of the notch 133. In other words, the above structure may also be regarded as a connection port used by the circuit board 130 to provide the connector 110 for docking.

Correspondingly, the clamping terminals 112 of the connector 110 form a pair of first clamping arms 112a and a pair of second clamping arms 112b at two opposite ends thereof, wherein the first clamping arms 112a are used for clamping on the circuit board 130 and abutted against the first electrically conductive members 131 and 132 of the circuit board 130 respectively, so that the clamping terminals 112 of the connector 110 are electrically connected to the circuit board 130. In the present embodiment, the other two opposite sides of the body 111 where the clamping terminals 112 and the pogo pin terminals 113 are not extended also have grooves 111a and 111b respectively, so that the partial structure in which the circuit board 130 is located in the notch 133 may fit into the grooves 111a and 111b respectively.

The first electrically conductive members 131 and 132 may be distinguished into a plurality of contact pad pairs located on the two opposite surfaces S1 and S2 of the circuit board 130, arranged from the first side to the second side of the X-Y plane, and the same pair of first clamping arms 112a of the same clamping terminal 112 clamp and are abutted against the same contact pad pair. Taking FIG. 2 and FIG. 3 as an example, the first electrically conductive members 131 are numbered A1, A2, A3, and A4, and the first electrically conductive members 132 are numbered B1, B2, B3, and B4, wherein the matching pairs are No. A1 and No. B1, No. A2 and No. B2, No. A3 and No. B3, and No. A4 and No. B4, i.e., four sets of contact pad pairs. As shown in FIG. 4A or FIG. 4B, what is clamped by the same pair of first clamping arms 112a is the first electrically conductive member 131 numbered A1 and the first electrically conductive member 132 numbered B1.

Please refer to FIG. 4A and FIG. 4B again. By clamping the circuit board 130 via the first clamping arms 112a, and partially fitting the circuit board 130 into the grooves 111a and 111b, the structural mounting effect of the connector 110 and the circuit board 130 may be achieved. In this way, via only structural abutting and clamping without the need for additional welding, the disassembly and assembly costs needed for assembly and subsequent maintenance may be reduced due to process simplification and less solder. At the same time, since the connector 110 and the circuit board 130 also adopt a structural assembly process, there is no need to perform a surface mounting (attachment) process (SMT), thus not only reducing the cost needed for related processes but also preventing the electronic elements on the circuit board 130 from being damaged in the SMT.

Moreover, the second clamping arms 112*b* of the clamping terminal 112 are clamped to the pogo pin terminals 113. Here, the pogo pin terminals 113 include a barrel 113*c*, a spring 113*b*, and a terminal post 113*a*. The terminal post 113*a* is movably assembled to the barrel 113*c*, and the spring 113*b* is abutted between the inner bottom surface of the barrel 113*c* and the terminal post 113*a*, wherein the elastic force of the spring 113*b* constantly drives the terminal post 113*a* to move away from the barrel 113*c*, so that a stop structure needs to be provided between the terminal post 113*a* and the barrel 113*c* to prevent the terminal post 113*a* from falling off the barrel 113*c*. The second clamping arms 112*b* are clamped to the barrel 113*c*, and the clamping point is packaged in the body 111 to facilitate combination. Here, the clamping terminals 112 and the pogo pin terminals 113 are coupled to each other one-to-one.

Moreover, as shown in FIG. 2 and FIG. 3, the clamping terminals 112 also have a protrusion 112*c* located on the first clamping arms 112*a* abutted in a recess 111*c* outside the body 111 to facilitate the bonding strength between the clamping terminals 112 and the body 111.

Please refer to FIG. 4A and FIG. 4B again, and compare the relative positions of the members shown in FIG. 1. In the present embodiment, the second electrically conductive members 121*a* have abutting surfaces TS, and the abutting surfaces TS are tilted relative to the plane at which the pogo pin terminals 113 are arranged (i.e., the X-Y plane). As shown in FIG. 2 and FIG. 3, the abutting surfaces TS of the second electrically conductive members 121*a* are substantially each extended along a longitudinal direction V1 to form a straight waterfall structure parallel to each other. The longitudinal direction V1 here is the extension axis direction in which the abutting surfaces TS are tilted with respect to the Z-axis, and forms a tilting angle θ.

Since the abutting surfaces TS are tilted relative to the Z-axis, the fan 120 and the connector 110 may be combined with each other by moving along the Z-axis and achieve the desired abutting effect. The details are as follows: first, the clamping and assembly of the circuit board 130 and the connector 110 are completed, then the two may be disposed (assembled) to the body 140, and then the fan 120 is assembled to the corresponding position of the body 140 from top to bottom along the Z-axis. Simply put, the fan 120 is assembled and coupled to the connector 110 from above the connector 110 along the axis direction (Z-axis direction). During the assembly and combining process, for the second electrically conductive members 121*a* and the terminal post 113*a* of the pogo pin terminals 113 that need to be connected to each other, the fan 120 moving in the negative Z-axis direction is equivalent to moving the terminal post 113*a* of the pogo pin terminals 113 from a first terminal E1 of the abutting surfaces TS to a second terminal E2 of the abutting surfaces TS, and the spring 113*b* is continuously deformed during the movement. In this way, the movement process is the transition from FIG. 4A to FIG. 4B. The terminal post 113*a* and the spring 113*b* are continuously pressed by the tilted abutting surfaces TS, so that the spring 113*b* may accumulate elastic force, as shown in FIG. 4B. After the connector 110 and the fan 120 are assembled, the spring 113*b* is in a compressed and deformed state to ensure that the spring 113*b* may constantly drive the terminal post 113*a* to be abutted on the abutting surfaces TS of the second electrically conductive members 121*a*.

The tilting here mainly refers to the relative movement direction of the abutting surfaces TS and the fan 120 during assembly (as mentioned above, the connector 110 and the circuit board 130 are assembled to the body 140 and may be regarded as a fixed state). That is, pressure may be continuously applied to the terminal post 113*a* and the spring 113*b* via the non-parallel relationship between the abutting surfaces TS and the fan 120, but the tilting angle θ does not need to be limited.

The corresponding relationship between the connection port 121 of the fan 120 and the connector 110 may ensure that the body 140 or the fan 120 subsequently generates vibration. Even when the body 140 falls, the terminal post 113*a* is still abutted on the abutting surfaces TS due to the elastic force (of the spring 113*b*) and is not detached. Therefore, the electrical connection relationship between the connector 110 and the fan 120 may be ensured.

Based on the above, in the above embodiments of the invention, the circuit board and the fan may simultaneously complete the electrical connection requirements via the structural assembly process of the connector, wherein the plurality of first electrically conductive members at the circuit board and the upper and lower surfaces thereof are clamped by the clamping terminals of the connector, so that the electrical connection between the connector and the circuit board is completed.

Moreover, the connection port is partially disposed at the sidewall of the fan, the second electrically conductive members are disposed in a straight waterfall shape, and the abutting surfaces in a straight waterfall shape are substantially tilted relative to the assembly axis direction of the fan. Correspondingly, the connector also has a plurality of pogo pin terminals. The pogo pin terminals are arranged on a plane, and the abutting surfaces are tilted relative to the plane. Therefore, during the assembly process of the fan and the connector, the pogo pin terminals may always maintain an abutting relationship with the second electrically conductive members due to the tilted abutting surfaces. That is, during the assembly process, the abutting surfaces may continuously exert pressure at the terminal post and the spring, causing the spring to continuously deform. Therefore, the elastic force accumulated by the spring may constantly drive the terminal post to be abutted against the abutting surfaces of the second electrically conductive members, preventing the terminal post from being detached from the abutting surfaces due to vibration or falling. Thereby, the electrical connection relationship between the connector and the fan is maintained.

In this way, the circuit board, the connector, and fan may be assembled using the above intuitive members, while simultaneously completing the effect of electrical assembly to effectively improve the convenience of assembly of related members of the laptop computer, thus further improving the regeneration (repairability) capability of the laptop computer to meet sustainability conditions.

What is claimed is:
1. A laptop computer, comprising:
   a circuit board having a plurality of first electrically conducting members;

a connector having a body and a plurality of clamping terminals and a plurality of pogo pins extended from the body, the clamping terminals and the pogo pin terminals are electrically connected to each other and located at two opposite sides of the body, and the clamping terminals clamp the circuit board and are electrically connected to the first electrically conductive members; and a fan having a plurality of second electrically conducting members, and the pogo pin terminals are respectively abutted against abutting surfaces of the second electrically conducting members, such that the circuit board is electrically connected to the fan via the connector, wherein each of the abutting surfaces is tilted relative to a plane where the pogo pin terminals are arranged.

2. The laptop computer of claim 1, wherein each of the pogo pin terminals comprises a spring and a terminal post, and the spring constantly drives the terminal post to be abutted against the corresponding abutting surface.

3. The laptop computer of claim 2, wherein the fan is assembled and combined to the connector along an axis direction from above the connector, in the process of assembling and combining, in the second electrically conductive members and the pogo pin terminals connected to each other, the terminal posts of the pogo pin terminals are moved from a first terminal of the abutting surface to a second terminal of the abutting surface and continuously deforms the spring, and the axis direction is a normal direction of the plane.

4. The laptop computer of claim 1, wherein the abutting surfaces of the second electrically conductive members are parallel to each other and extended along a longitudinal direction to form a straight waterfall structure.

5. The laptop computer of claim 1, wherein the fan has a sidewall, a plurality of annular grooves are formed on a plurality of cross sections of the sidewall, and the second electrically conductive members are respectively disposed in the annular grooves.

6. The laptop computer of claim 1, wherein each of the second electrically conductive members has a closed contour.

7. The laptop computer of claim 1, wherein each of the clamping terminals has a pair of first clamping arms, the first electrically conductive elements are divided into a plurality of contact pad pairs located on two opposite surfaces of the circuit board arranged from a first side to a second side of the plane, and the pair of first clamping arms of the same clamping terminal clamp and are abutted against the same contact pad pair.

8. The laptop computer of claim 7, wherein each of the clamping terminals also has a pair of second clamping arms clamped to the same pogo pin terminal, and the pair of first clamping arms and the pair of second clamping arms are two opposite ends of the clamping terminal.

9. The laptop computer of claim 8, wherein a clamping point of the pair of second clamping arms and the pogo pin terminal is packaged in the body, and each of the first clamping arms has a protrusion abutted in a recess outside the body.

10. The laptop computer of claim 1, wherein the pogo pin terminals are combined with the clamping terminals one-to-one, the body has a pair of grooves located at two opposite sides of the pogo pin terminals and the clamping terminals, and the circuit board is partially fitted into the pair of grooves.

* * * * *